United States Patent
Stott et al.

(10) Patent No.: US 6,999,594 B2
(45) Date of Patent: *Feb. 14, 2006

(54) METHOD AND APPARATUS FOR REDUCTION OF UNWANTED FEEDBACK

(75) Inventors: Jonathan Highton Stott, Tadworth (GB); Nicholas Dominic Wells, Tadworth (GB)

(73) Assignee: British Broadcasting Corporation, London (GB)

( * ) Notice: Subject to any disclaimer, the term of this patent is extended or adjusted under 35 U.S.C. 154(b) by 710 days.

This patent is subject to a terminal disclaimer.

(21) Appl. No.: 09/781,650

(22) Filed: Feb. 12, 2001

(65) Prior Publication Data

US 2002/0044667 A1    Apr. 18, 2002

Related U.S. Application Data

(63) Continuation of application No. 09/068,131, filed as application No. PCT/GB96/02643 on Oct. 30, 1996, now Pat. No. 6,269,165.

(30) Foreign Application Priority Data

Oct. 30, 1995  (GB) .................................. 9522204

(51) Int. Cl.
   *H04B 15/00*  (2006.01)

(52) U.S. Cl. ...................................................... 381/93
(58) Field of Classification Search ................. 381/83, 381/93; 375/211, 219, 295
See application file for complete search history.

(56) References Cited

U.S. PATENT DOCUMENTS

| 5,091,952 | A  | * | 2/1992 | Williamson et al. ......... 381/318 |
| 5,259,033 | A  | * | 11/1993 | Goodings et al. ............ 381/318 |
| 5,680,467 | A  | * | 10/1997 | Hansen ........................ 381/314 |
| 6,269,165 | B1 | * | 7/2001 | Stott et al. ...................... 381/93 |

* cited by examiner

*Primary Examiner*—Brian T. Pendleton
(74) *Attorney, Agent, or Firm*—George W. Neuner; Edwards & Angell LLP

(57) ABSTRACT

An RF active deflector is described for use with orthogonal frequency division multiplex signals. An input antenna receives an RF input signal and an output antenna transmits an RF signal on substantially the same frequency as the input signal. An amplification path between the input antenna and the output antenna provides substantially linear processing and includes a delay. Means responsive to the signal in the amplification path produce a plurality of control coefficients. A transversal filter receives the signal in the amplification path and, under control by the control coefficient, provides a modified signal. A combiner is provided for combining the modified signal with the signal in said amplification path so as to reduce the effect of the feedback.

11 Claims, 11 Drawing Sheets

METHOD AND APPARATUS FOR REDUCTION OF UNWANTED FEEDBACK

This application is a continuation of U.S. application Ser. No. 09/068,131, filed Apr. 30, 1998, now U.S. Pat. 6,269, 165, which is a 371 of PCT/GB96/02643, filed Oct. 30, 1996, the teachings of which are incorporated herein by reference.

This invention relates to a method of and apparatus for reduction of unwanted feedback in a system.

Unwanted feedback naturally follows from the use of amplifiers. It has the effect of making uncontrolled changes to the frequency response of a system. As a result it sets a limit to the gain which can be used before oscillation or unacceptable degradation of the frequency response occurs.

A well-known example of such feedback is with public address systems, where a microphone used by a person speaking or playing a musical instrument picks up the output of a nearby loudspeaker, giving rise to a howl which drowns out the speech or music and renders it unintelligible. This is sometimes termed 'howl-around'. The system which gives rise to this is illustrated in outline in FIG. 1, which is a plan of a stage system 10 used by a speaker 12 to address an audience. His speech is picked up by a microphone 14, and the resultant signal amplified by an amplifier 16. A loudspeaker 18 broadcasts the sound, some of which is picked up by the microphone 14, either directly or after reflection from the walls of the building or stage etc. Such a sound path is indicated by the reference 20.

It is possible to draw an equivalent circuit to this, as shown in FIG. 2. In FIG. 2 is seen a signal source 30, in this case the speaker 12 of FIG. 1, and an input path 32 representing the sound path between the speaker and the microphone 14. At the microphone the sound from the speaker through input path 32 is combined in circuit 34 with sound from the unwanted feedback path 36 which corresponds to the sound path 20 of FIG. 1. The combined signal from combiner 34 is applied to the amplifier 38 in FIG. 2, corresponding to the amplifier 16 and loudspeaker 8 in FIG. 1. The output 39 of amplifier 38 both constitutes the desired output and provides the input to the feedback path 36.

A similar situation arises in a rebroadcast transceiver which is designed to receive RF signals, amplify them, and retransmit them onward on the same frequency. While steps are taken, e.g. by using highly directional antennas, to reduce unwanted feedback, there is inevitably some unwanted feedback from the transmitting is antenna back to the receiving antenna.

FIG. 3 is a generalised diagram based on FIG. 2, showing the transfer functions of the various parts of the system. It is assumed that the input signal 30 has spectrum I(f), the input path 32 has a frequency response H(f), the unwanted feedback path 36 has a response B(f), the amplifier 38 has a response A(f), and the output signal 39 has spectrum O(f). The resulting overall transfer function is:

$$\frac{O(f)}{I(f)} = \frac{A(f)H(f)}{1 - A(f)B(f)} \quad (1)$$

As the complex-valued loop gain A(f)B(f) approaches (1+j0), the system becomes unstable. If the loop contains a dominant delay which is significant compared with the reciprocal of the system bandwidth, then the frequency response contains regular ripples.

To remove the effect of this feedback it needs to be cancelled out. This can be done using either of the circuits of FIG. 4 or FIG. 5. In FIG. 4, a compensating circuit 40 with transfer function C(f) has its input connected to the output of the amplifier 38. The output of the compensating circuit 40 is combined in a combining circuit 42 with the output of the existing combiner 34, and the output applied to the input of the amplifier 38. Such a circuit cancels out the unwanted feedback so long as C(f)=−B(f). This is known as neutralisation.

The overall transfer function now becomes:

$$\frac{O(f)}{I(f)} = \frac{A(f)H(f)}{1 - A(f)\{B(f) + C(f)\}} \quad (2)$$

Commonly, some simple technique is used to ensure that C(f)=−B(f) at some spot frequency which is most critical. Depending on the exact circuit used to ensure that the deliberate feedback has the right amplitude and phase this will give a more or less narrow-band solution.

Once feedback cancellation has been achieved, the final output is what would be expected, given that the signal has travelled the input path H(f):

$$\frac{O(f)}{I(f)} = A(f)H(f) \quad (3)$$

However, the circuit of FIG. 4 has certain disadvantages. For example, it might not be desired to tap off some of the amplifier output signal into the compensating path. Also, in the context of RF transmission, if the processing is done at an intermediate frequency (or at baseband), the circuit of FIG. 4 requires two down-converters. This is particularly disadvantageous if the processing in the compensating path is digital, since each down-converter must also then be accompanied by filtering and analogue-to-digital conversion.

The circuit of FIG. 5 is therefore preferred. In this circuit the compensating path 44 with transfer function D(f) has its input coupled in parallel with the input of the amplifier 38, rather than being connected to its output. The compensating path 44 together with the combining circuit 42 now form a pre-corrector 46 for the amplifier 38.

The transfer response in this case is:

$$\frac{O(f)}{I(f)} = \frac{A(f)H(f)}{1 - D(f) - A(f)B(f)} \quad (4)$$

To cancel the unwanted feedback D(f) is chosen so that D(f)=−A(f)B(f)

An example of a circuit of the type shown in FIG. 5 is described in UK Patent Application GB-A-2 065 421. This describes a rebroadcast transceiver which compensates at baseband prior to amplification by a power amplifier. The circuit described in GB-A-2 065 421 is presented in FIG. 6 of the present application. This figure is not as such in GB-A-2 065 421, but is based on its contents. The rebroadcast transceiver 300 is used to receive the off-air broadcast from source 330 through channel 332, combined at 334 with feedback from the transceiver output through path 336. The main amplifier 319 of the transceiver is preceded by a pre-corrector 346 which is fed by a signal on an antenna line 301 from combiner 334.

The pre-corrector comprises a series circuit containing a down-converter 304, a combining circuit 342, a low-pass filter 309, an amplifier 313, a delay 314, and an up-converter 311. A multiplicative mixer 324 is connected to receive and multiply together the input and the output of the delay 314. The output of the multiplicative mixer 324 is applied through a low-pass filter 326. A second multiplicative mixer 325 receives and multiplies together the output of the delay 314 and the output of the low-pass filter 326. The output of the second multiplicative mixer 325 is applied to the second input of the combining circuit 342 (actually represented by a simple junction in the patent specification).

Because of the down-conversion operation, it is important to retain both phase and amplitude information in the signal. For this purpose the pre-corrector 346 operates with complex signals, but this complexity is not shown in FIG. 6, for simplicity of explanation.

The circuits 324, 325 and 326 are together referred to as a "correlator" 320, the purpose of which is to compensate for feedback signals through path 336. The "correlator" 320 is stated to "correlate" unwanted frequencies sensed after filtering by the low-pass filter 309 with the unwanted frequencies present at the output of the down-converter 304 so as to effect cancellation. In fact, however, the "correlator" generates only a single output coefficient. The delay 314 is stated to be necessary in order to distinguish between the wanted signals and the feedback signal, so that the "correlator" operates only to cancel the unwanted signal. However, other known correlators may be used to produce a similar result.

This circuit can however only provide proper compensation at a single frequency, and thus is an extreme example of a narrow-band solution to the problem. It may be adequate for, e.g., military communications, but it can not provide a solution which is acceptable for broadcast quality signals. A wide-band solution is therefore necessary.

The present invention is defined in the independent claims below, to which reference should now be made. Advantageous features are set forth in the dependent claims.

Preferred embodiments of the invention are described in more detail below. In the preferred embodiments the feedback caused between the output and the input of an amplification path is reduced by providing a delay in the amplification path, passing through the amplification path a signal having an auto-correlation function which is substantially a delta function, correlating the said signal before being delayed in the delay with the signal after being delayed in the delay to produce a plurality of correlation coefficients, modifying the signal in the amplification path to provide a modified signal, the modification being provided by a transversal filter controlled by the said plurality of correlation coefficients, and combining the modified signal with the signal in the amplification path so as to reduce the effect of the feedback. The signal having an auto-correlation function which is substantially a delta function may be an added noise signal or may be constituted by the signal being processed itself. The system can be used to reduce 'howl-around' in audio situations or feedback in simultaneous coherent re-broadcast transceivers.

The invention will be described by way of example with reference to the accompanying drawings, in which.

As discussed above, a narrow-band solution to the problem of unwanted feedback has been proposed. However, we have appreciated that in principle a wide-band result should be possible. The unwanted feedback is causal. In many cases it can be modelled to sufficient accuracy as a Finite Impulse Response (FIR) filter. It follows that what is needed for correction is the equal-and-opposite FIR, which is thus also causal and inherently stable. It is necessary to determine its response, and to adjust it if the unwanted feedback varies with time. This applies both to the circuit configuration of FIG. 4, and to that of FIG. 5. Provided that the amplifier has a finite impulse response, D(f) is also FIR in form, though a little 'longer' than C(f) of FIG. 4.

The configuration of the compensating path 44 feeding round through the adder 42 has the effect of making the FIR response D(f) in effect an Infinite Impulse Response (IIR) pre-corrector to the amplifier 38. This makes measurement difficult, but it is nevertheless possible, as described below.

First Embodiment

The construction of a first feedback reduction system embodying the invention will be described with reference to FIGS. 7 and 8. The theory of operation of the circuit will then be explained subsequently.

Figure 5:
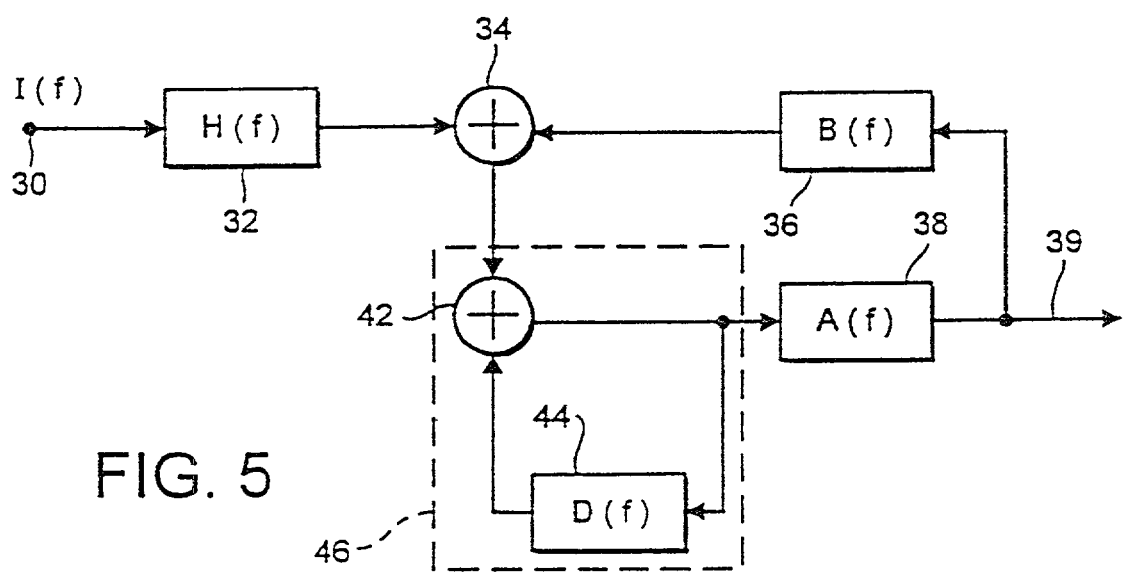
FIG. 5 is a diagram similar to FIG. 3 showing another way of providing compensation for the feedback.
Figure 6:
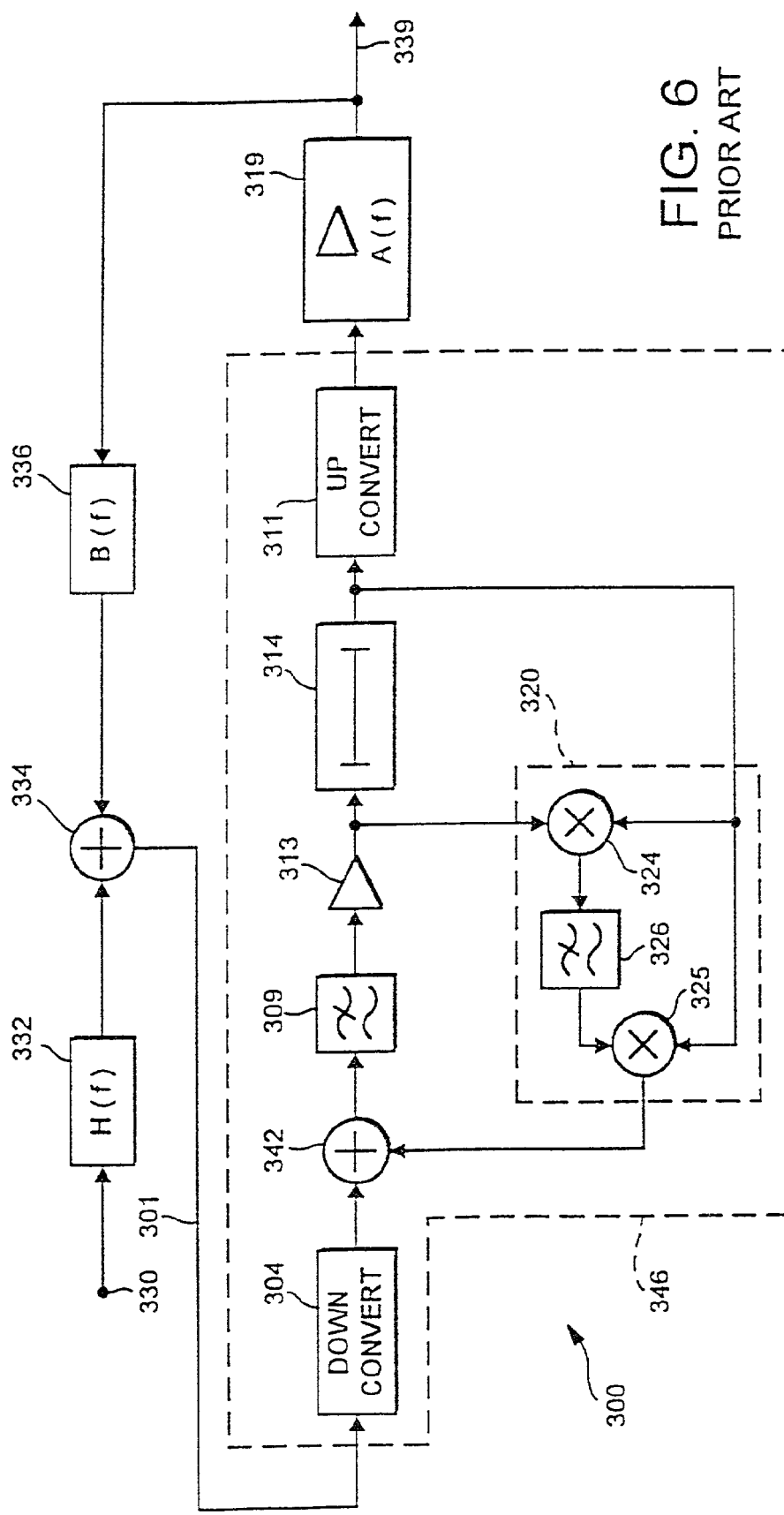
FIG. 6 is a block diagram of a known re-broadcast transceiver.
Figure 7:
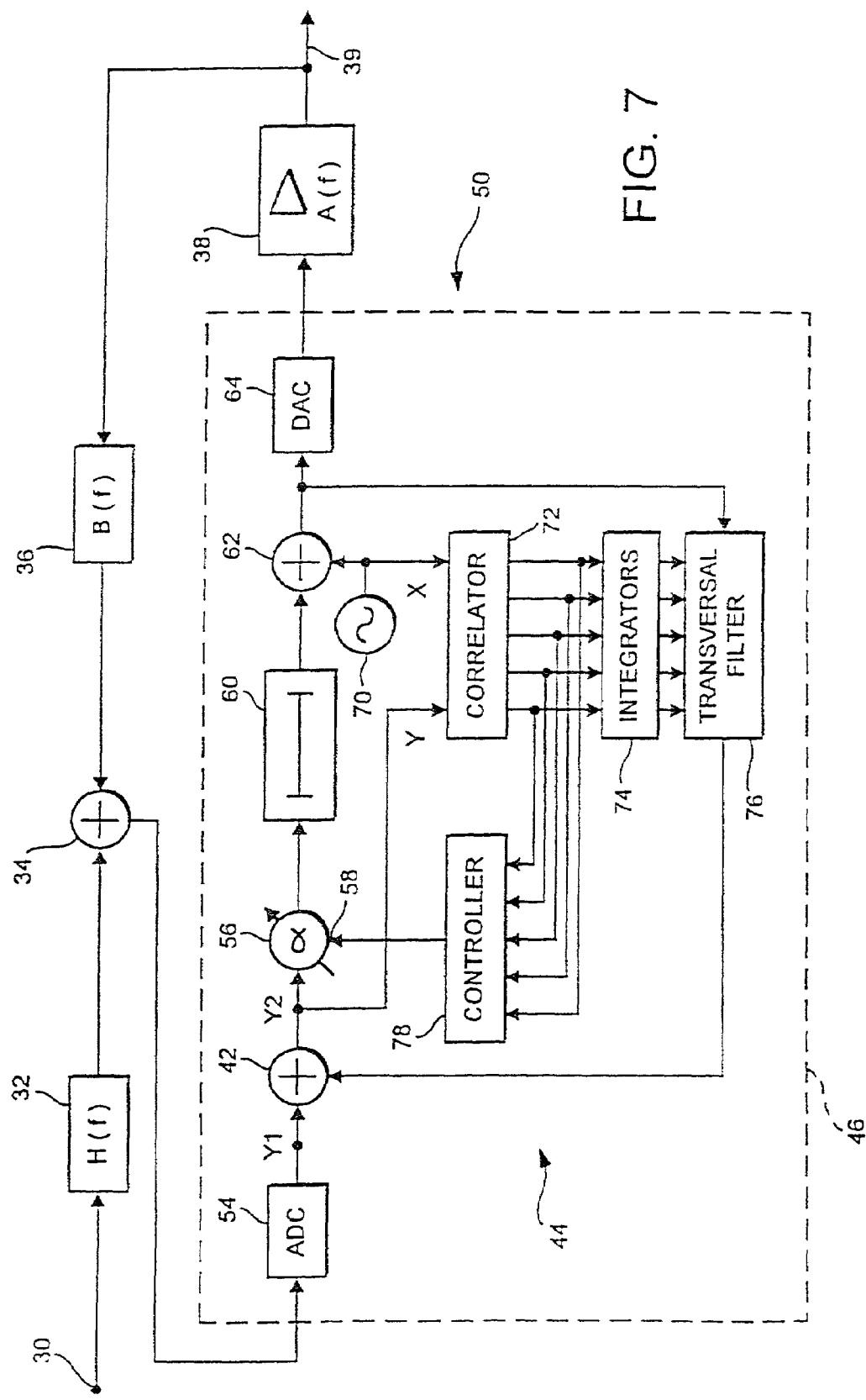
FIG. 7 is a block diagram of a first feedback reduction system embodying the invention, for use with baseband signals.

The circuit of FIG. 7 is of the type shown in FIG. 5. Thus, a signal source 30 is coupled through an input path 32 and combined in a combiner 34 with unwanted feedback from a feedback path 36. The output of the combiner 34 is applied through a pre-corrector 46 to a main amplifier 38, the output 39 of which provides the desired output which also feeds the feedback path 36.

As noted above, such a situation pertains in many instances where unwanted feedback arises. These include, for example, public address systems. The circuit of FIG. 7 is suitable for operation with signals at baseband, for example audio signals, and could be used in a public address environment to reduce undesirable 'howl-around'.

The amplification path comprising the circuit elements 54, 42, 56, 60, 62 and 64 contains only linear processing elements, and thus the path provides substantially linear processing on the signal passing through it.

The processing in the pre-corrector 46 is essentially done digitally, and so the input to the pre-corrector 46 is converted to digital form in an analogue-to-digital converter 54. The output of the analogue-to-digital converter is supplied to one input of the combiner 42, the output of which is applied to a series circuit comprising a variable-gain amplifier 56, the gain of which can be controlled in response to a control signal received at a control input 58 of the amplifier 56, a delay device 60, and an adder 62. The output of the adder 62 is converted back to analogue form by a digital-to-analogue converter 64.

The pre-corrector 46 further includes a noise signal generator 70. The output of the noise signal generator is applied to the adder 62 in the main signal path, and is also applied to an input X of a correlator 72. The correlator also receives at an input Y the output of the adder 42, that is to say the signal in the main signal path prior to delay in the delay 60 and amplification in the variable-gain amplifier 56. The correlator 72 provides a plurality of outputs representing the correlation coefficients between the signals at its X and Y inputs. These outputs are applied to an integrator block 74. The outputs of the integrator block are then applied to control a transversal filter 76, which receives its signal input from the output of the adder 62 in the main signal path and provides its output to the second input of the adder 42. The output of the transversal filter is designed to compensate for the unwanted feedback.

The output of the correlator 72 is also applied to a controller circuit 78, described below, which controls the gain of the variable-gain amplifier 56 through its control input 58.

Figure 8:
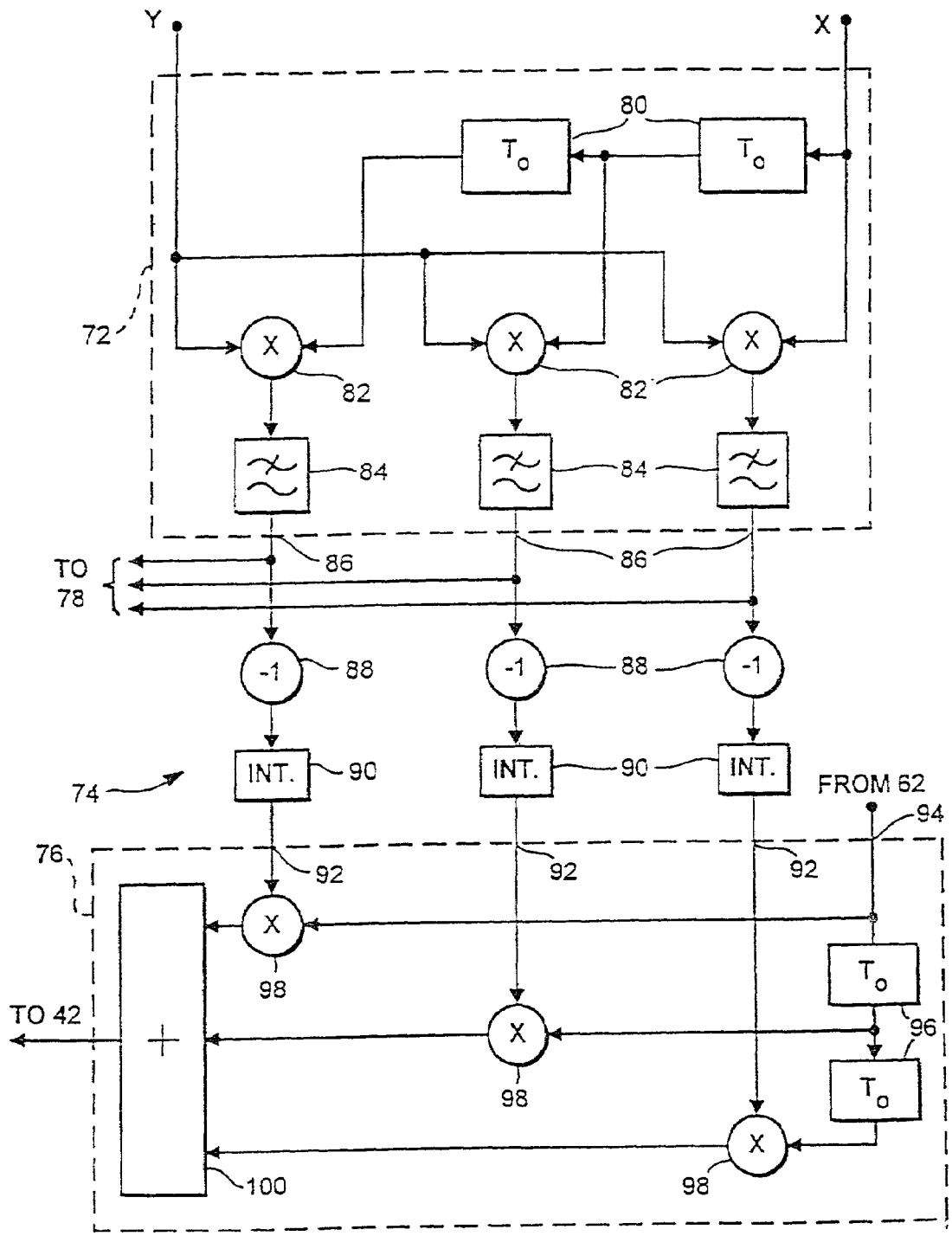
FIG. 8 shows part of FIG. 7 in more detail.

The construction of the correlator 72, the integrator block 74, and the transversal filter 76 are shown in more detail in FIG. 8. The correlator comprises a number of stages. For simplicity of explanation, only three stages are shown, but in practice a larger number of stages will be used. The number of stages depends upon (i) the tap spacing, which is determined by the normal requirements of the Nyquist sampling thereon and the bandwidth over which the compensation is to work, i.e. at least that of the signal, and (ii) the total lengths of the response to be compensated, i.e. the extend of the convolved impulse responses of feedback path 36 and amplifier 38. Thus while only three stages are shown, it should be borne in mind that typically there will be n stages.

To the input X of the correlator 72 are connected a series of (n−1), in this case two, delays 80, each providing an incremental delay of duration To. The delay time $T_0$ is chosen according to the desired resolution of measurement of H(f) or rather its time-domain equivalent h(t). The correlator 72 also includes n multipliers 82. Each multiplier 82 receives at one input a corresponding one of the X input and the (n−1) delayed versions of the X input as supplied by the delays 80, and at the other input the signal at the Y input of the correlator 72. Finally the correlator includes n low-pass filters 84, which each receive the output of a corresponding one of the multipliers 82, and provide a corresponding output of the correlator 72. The n outputs 86 from the correlator 72 represent n correlation coefficients $\Phi_1, \Phi_2, \ldots \Phi_n$.

The n outputs 86 of the correlator 72 are applied to the controller 78 to control the gain of the variable-gain is amplifier 56, in a manner which is described below.

The n outputs 86 of the correlator 72 are also applied through inverters 88, the purpose of which is described below, to respective integrator circuits 90 forming the integrator block 74. The integrator circuits provide an averaging function, and hold a value which is then used by the transversal filter 76. In practice, the integrators 90 and low-pass filters 84 may be combined.

The transversal filter 76 has control inputs 92 connected to the integrators 90, and a signal input 94 connected to the output of the adder 62 in the main signal path. The transversal filter 76 has n stages, corresponding to the n stages in the correlator 72, and in this simplistic example has only three stages. The signal at the input 94 is applied to the beginning of a series of (n−1) incremental delays 96 each of length To, similar to the delays 80. A series of n multipliers 98 each have one input coupled to one of the input 94 and the (n−1) delayed versions of it supplied by the delays 96, and the other input coupled to a respective one of the inputs 92. The outputs of the multipliers 98 are then all applied to an adder 100, the output of which constitutes the output of the transversal filter 76, and is applied to the second input of the adder 42 in FIG. 7. The transversal filter 76 is thus seen to be of conventional design, with a tapped delay line comprising delays 96, coefficient multipliers 98 receiving respective coefficients at inputs 92, and an adder 100 providing the output.

Theory of Operation

Figure 1:
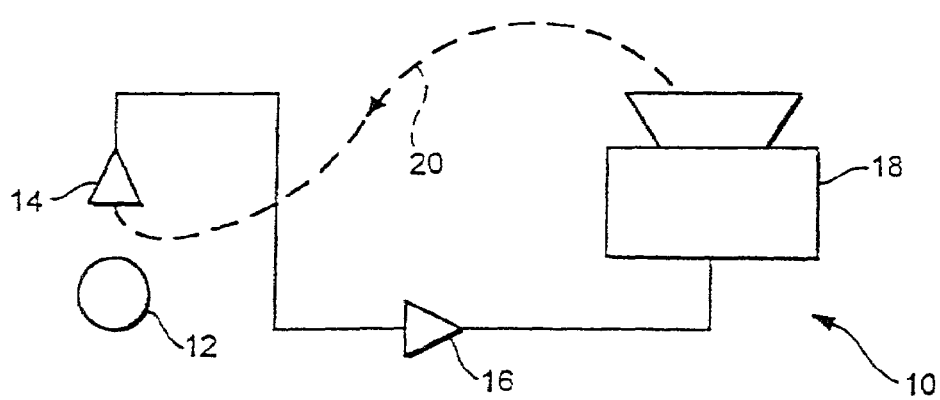
FIG. 1 is a diagrammatic view of a situation in which unwanted feedback can develop.
Figure 2:
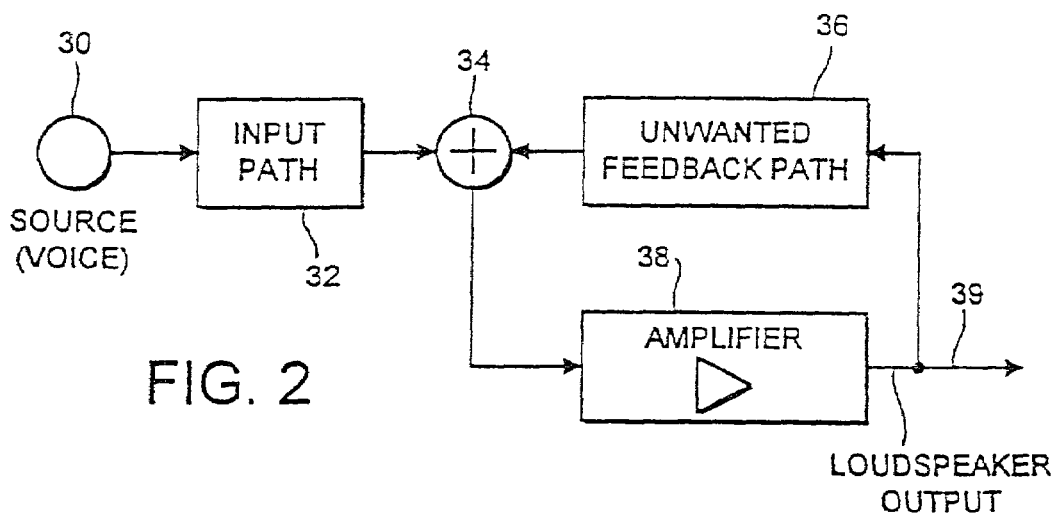
FIG. 2 is an equivalent circuit diagram for the situation depicted in FIG. 1.
Figure 3:
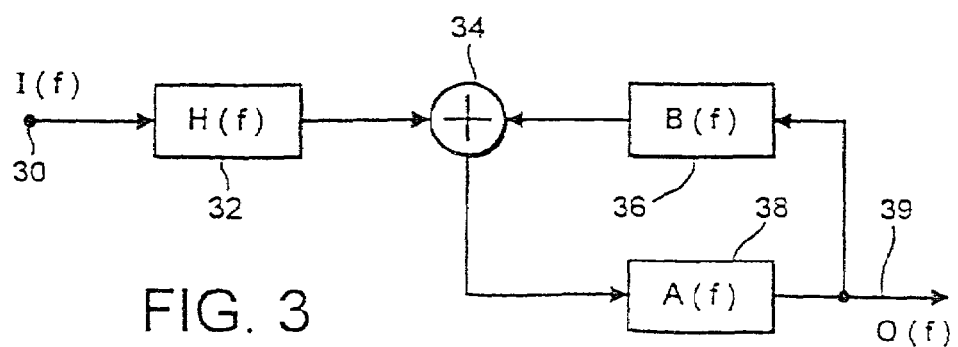
FIG. 3 is a generalised diagram based on FIG. 2 showing the transfer functions of the various parts.
Figure 4:
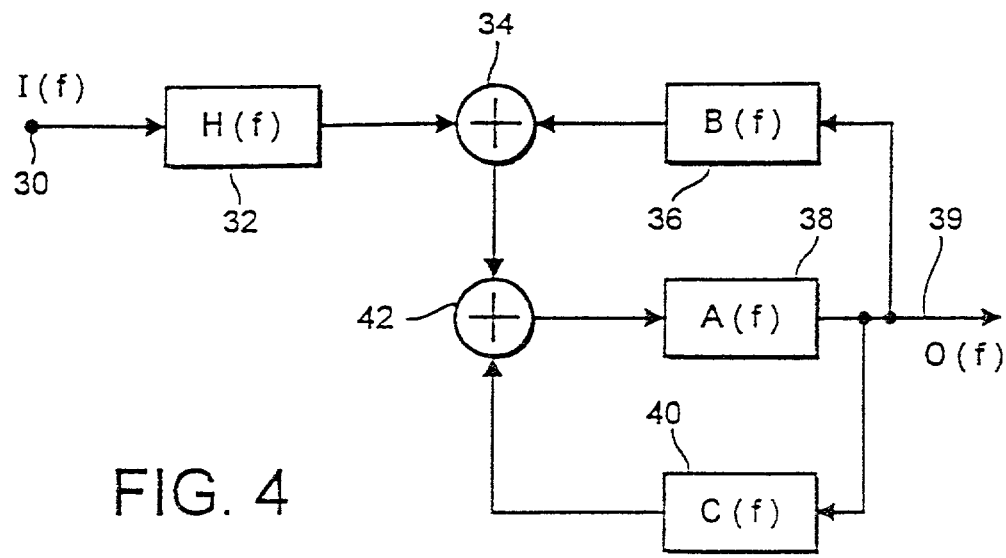
FIG. 4 is a diagram similar to FIG. 3 showing one way of providing compensation for the feedback.

The circuit of FIG. 7 is based on the configuration of FIG. 5, which is the preferred configuration, but the principles on which it operates are also applicable to the FIG. 4 arrangement. The following description of the is theoretical basis for the operation of the circuit will thus cover both the FIG. 4 and FIG. 5 systems, and will commence with FIG. 4.

Figure 9:
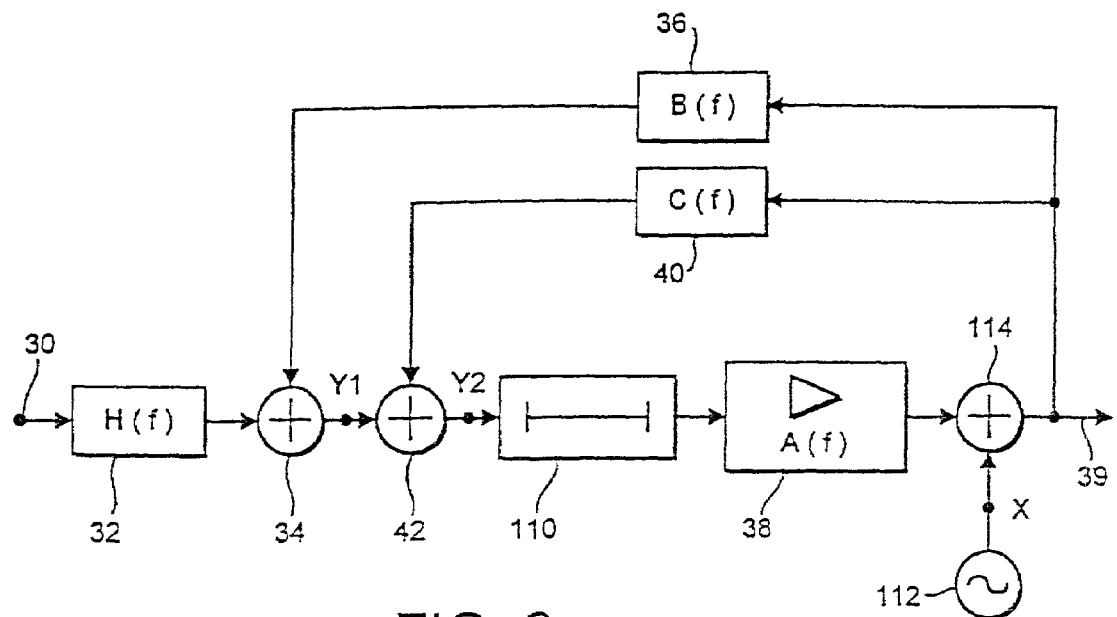
FIGS. 9 and 10 are successive re-arrangements of FIG. 4 illustrating the theory of operation.

It will be recalled that FIG. 4 shows the equivalent circuit diagram for a system with feedback, in which a compensating path is added in parallel with the feedback path and is arranged to cancel out the feedback. The FIG. 4 circuit can be arranged into the form shown in FIG. 9, with certain elements added. In FIG. 9, a delay 110 is added in series with the amplifier 38, and a noise source 112 is provided. An adder 114 adds the outputs of the noise source 112 and the amplifier 38, and provides the output 39 of the circuit.

The circuit of FIG. 9 can then be re-arranged into the form shown in FIG. 10, this again being equivalent to FIG. 4 but with the same added components. (The similarity with FIG. 4 is however most easily seen by considering FIG. 9 first.) Since it is a simple circuit re-arrangement, it need not be considered in detail. Briefly, however, it is seen that the noise signal from source 112 is injected by adder 114 into the feedback path 36 and compensating path 40, the outputs of which are combined with each other and with the signal from the input path 32, and recirculated through the delay 110 and amplifier 38, to the adder 114.

Figure 11:
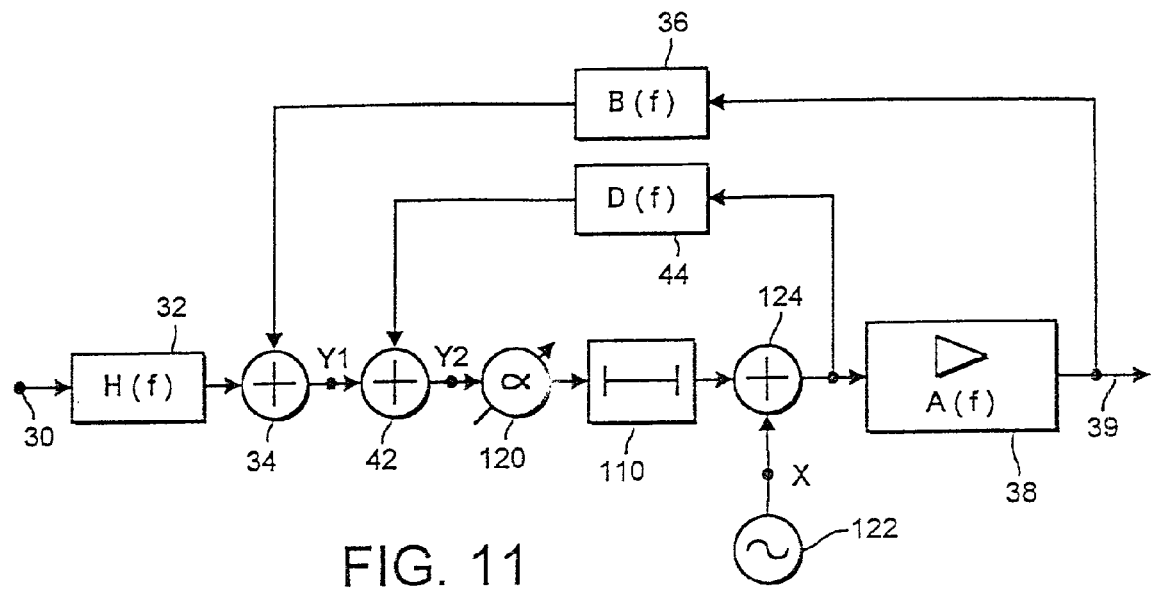
FIGS. 11 and 12 are successive re-arrangements of FIG. 5 illustrating the theory of operation.

Similarly, the circuit of FIG. 5 can be rearranged into the form shown in FIG. 11. In this instance the compensating path 44 is taken before the amplifier 38, and the additional components comprise the delay 110, as with FIG. 9, and also a variable-gain circuit 120 in series with the delay, a noise source 122, and an adder 124 adding the outputs of the noise source 122 and the delay 110 and providing an output to the amplifier 38 and to the compensating path 44. An advantage of the FIG. 5 arrangement over FIG. 4 is that the noise is injected at the input of the amplifier and not at the output, avoiding the need for such a high power noise source.

Figure 12:
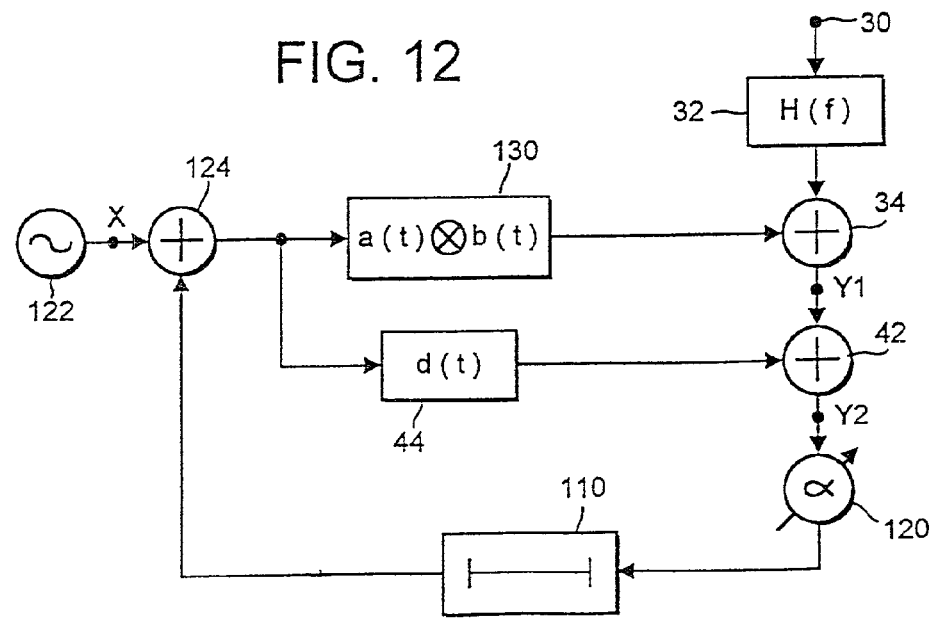

The circuit of FIG. 11 can now be rearranged into the form shown in FIG. 12. The noise signal from source 122 is injected by adder 124 into the composite path 130, which comprises the amplifier 38 and feedback 36, but which may be considered as one composite path as far as the noise is concerned, and also the compensating path 44. The outputs of these two paths are combined with each other and with the signal from the input path 32, and recirculated through the delay 110 to the adder 124. The signal output comes from within the composite path 130, but we are only interested in the noise component, and the main signal can be ignored, as seen below.

Figure 10:
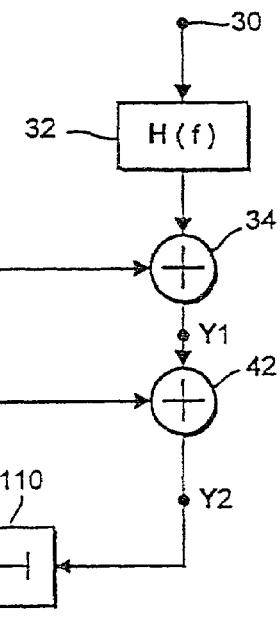

In order to cancel the unwanted feedback, it is desired, in relation to FIG. 10, to make the compensating path equal and opposite to the unwanted feedback path. Thus using the terminology above, it is desired to make C(f)=−B(f). In relation to FIG. 12, it is desired to make the compensating path equal to the combined effect of the amplifier and the unwanted feedback path. Thus it is desired to make D(f) =−A(f)B(f). If this is correctly achieved, the noise signal injected at adder 124 will be completely compensated, and the adder 42 will have zero noise contribution at its output.

The purpose of the feedback cancellation is to set C(f) or D(f) to the required function which is necessary to provide this cancellation. This can be achieved in either of two ways. The first way, which may be termed open-loop control, is to measure the distortion produced is in the unwanted feedback path 36 in FIG. 10 or the composite path 130 in FIG. 12, and set the compensating path accordingly. To do this it is necessary to measure the transmission characteristic between the point X, namely the output of the noise source 112 or 122, and the point Y1, which includes the output of the feedback path 36 or the composite path 130. The point Y1 comes after addition with the output of the input path 32 in adder 34, because this is all that is accessible. However the input signal is irrelevant as discussed elsewhere in this specification, and can thus be ignored. The second way, which may be termed closed-loop control, is to measure the residual noise appearing at the output of adder 42, and then adjust or correct the compensating path in accordance with the amount of noise detected. Thus the error is directly determined. To do this it is necessary to measure the transmission characteristic between the same point X, on the one hand, and the point Y2, namely the output of the adder 116. Again, the signal from the input path is irrelevant.

The transmission characteristic which is required is the finite impulse response of the path 36 or 130, respectively. However, due to the recirculation loop through the delay 110, the response between point X and point Y1 or Y2 will not be a finite impulse response (FIR), but rather will be an infinite impulse response (IIR), which is more difficult to measure.

Measurement of IIR

Our co-pending United Kingdom patent application No. 9522150.3 published under number 2,306,012 entitled "Method and apparatus for determining the response of a system containing a finite impulse response circuit coupled with a feedback loop" provides a method which can be used to measure the IIR of a circuit of the form of FIG. 10 or FIG. 12. This method involves determining the correlation between the signals at measuring points X and Y (whether Y1 or Y2). It will first be assumed that the input signal has zero correlation with the added noise source 112 or 122. If that is the case, the input signal and output signal can be ignored in FIGS. 10 and 12 (the output signal in FIG. 12 has already been ignored in the above discussion).

In accordance with the aforementioned co-pending patent application No. 9522150.3, published under 2,306,012 the response of a system containing a finite impulse response (FIR) circuit coupled with a feedback loop which introduces a loop delay $T_L$ can be determined. The method involves applying a test signal to the system, the test signal having an auto-correlation function which is the delta function, i.e., unity, meaning that the signal is uncorrelated with itself. This is the case with a true noise signal. In accordance with the method the input and output of the system under test are correlated. One of these is applied to delay means such as to produce a series of delayed signals, but with the total delay not exceeding the loop delay $T_L$. The other of the input and output of the system under test is multiplied with each of the delayed signals, and the resultants of the multiplication are smoothed to provide a degree of integration. The smoothed outputs will be representative of the correlation coefficients of the two inputs, and as shown in our aforementioned co-pending patent application, will represent the FIR of the FIR circuit.

Figure 13:
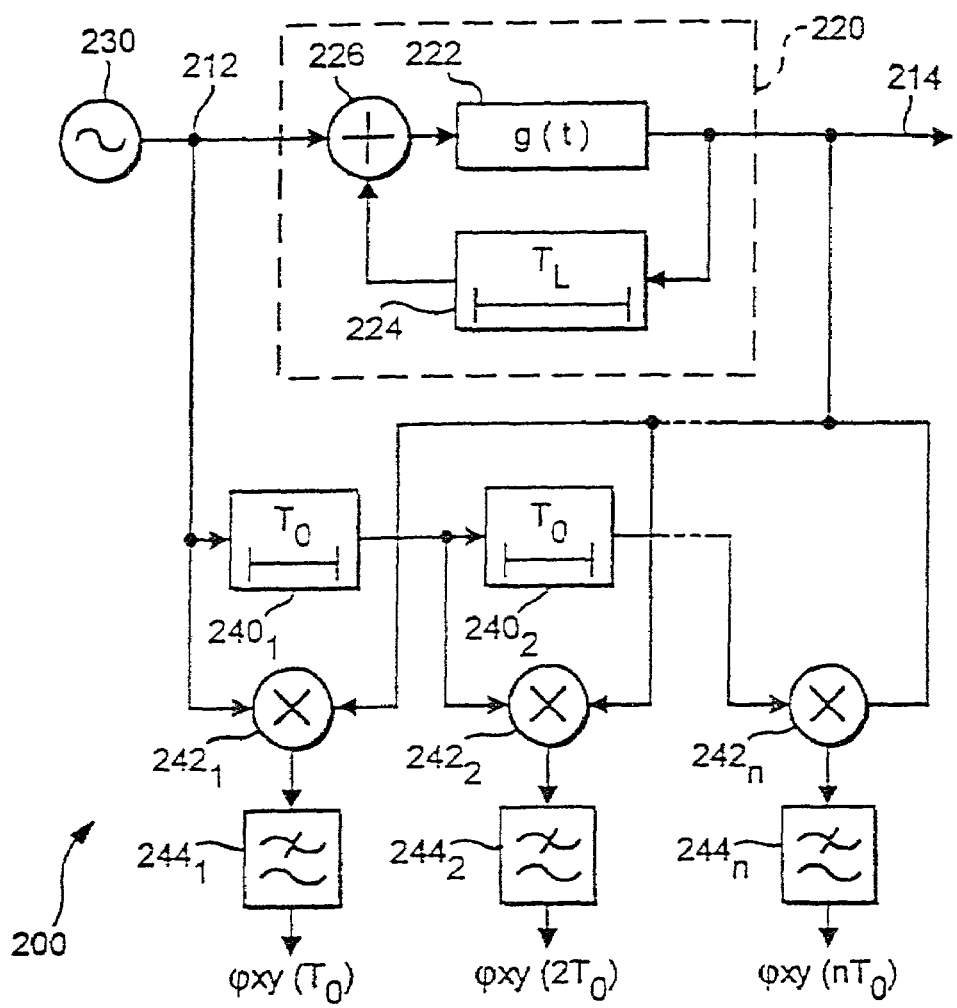
FIG. 13 is a diagram illustrating a method of measurement of finite impulse response of a circuit with a feedback loop.

A practical example of such a measurement system 200 is shown in FIG. 13, which is based on FIG. 5 of our aforementioned patent application. The system is designed to determine the FIR of an FIR circuit 222 with which is associated a feedback loop having a delay 224 of delay time $T_L$. The delay output is combined in an adder 226 with an input signal 212 from a signal source 230. The aim is to determine the time-domain response g(t) of the circuit 222, when it is only possible to measure the response of the whole circuit 220. Measurement is thus made between the input 212 and the output 214 of the circuit block 220. A series of individual delays $240_1$, $240_2$ ... $240_{(n-1)}$ are provided connected in series. The input of the first delay is connected to the input line 212 and receives the output of the signal source 230. Associated with each delay there is a respective multiplier $242_1$, $242_2$ ... $242_n$. Multiplier $242_1$ receives the input of the first delay $240_1$ and multiplies this by the output signal on output line 214. The output of the multiplier $242_1$ is then applied to a low-pass filter $244_1$. The low-pass filter effects the averaging or integrating function. The output of the low-pass filter $244_1$ then constitutes the first coefficient of the correlation function $\Phi_{xy}$.

As shown, the signal at the input 212 of the system under test is applied to the delays 240, and the signal at the output 214 is applied directly to the other inputs of the multipliers 242. However it could possibly be the other way round, with the signal at the output 214 applied to the delays 240, and the signal at the input 212 applied directly to the other inputs of the multipliers 242.

The circuit 200 of FIG. 13 correlates the signals at the input and the output of the circuit block 220, and produces a correlation function which comprises a series of n correlation coefficients. It is shown in our aforementioned co-pending application No.9522150.3 published under number 2,306,012 that these correlation coefficients define the FIR of the circuit 222, provided that certain conditions are met. These are that the auto-correlation function of the signal from source 212 is a delta function, and that the total delay of the series of delays 240 is less than the delay in the feedback loop 224, i.e. $Nt_0 < T_L$. A degree of smoothing will also be desirable if not necessary.

The overall response of the circuit block 220 will not be of finite impulse response (FIR) form, but will clearly be of infinite impulse response (IIR) form. However, the present inventor has appreciated that it is made up of successive convolutions of g(t) with itself, so that the first part of the overall response of circuit block 220, over the period $0<t<T_L$, will be identical to g(t). This assumes that g(t) is both causal and strictly limited in extent (time), such that g(t)=0 for t<0 and for $t \geq T_L$.

In other words, as described in the aforementioned application, they delay $T_L$ is greater than the unwanted delay in the feedback loop.

Figure 14:
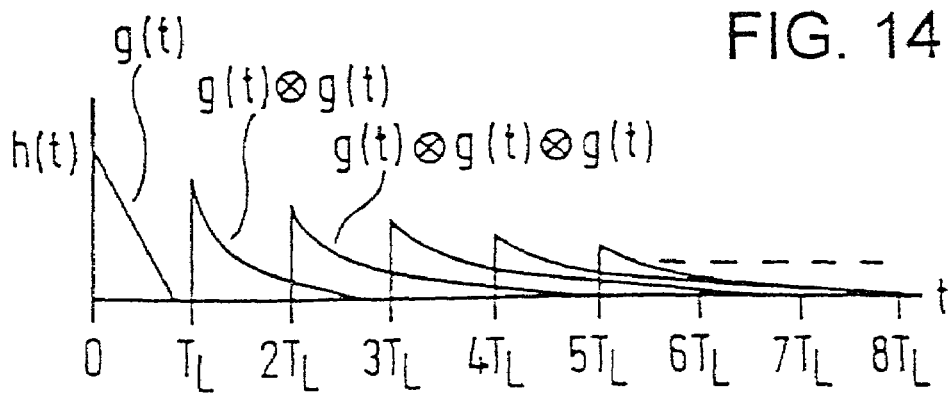
FIG. 14 illustrates how the finite impulse response becomes an infinite impulse response as a result of the feedback.

The manner in which the overall impulse response the is made up of the superposition of a series of 'echoes', that is to say successively more smeared-out versions of g(t), is shown in FIG. 14. For the initial period 0 to $T_L$, there is nothing coming round the feedback loop, so the overall response is seen to be g(t). For the next period between $T_L$ and $2T_L$, the overall response is equal to g(t) ⊗g(t). For the third period between $2T_L$ and $3T_L$, the overall response contains the component g(t) ⊗g(t) ⊗g(t) as well. This continues for further time periods. However, it is also seen that, provided consideration is confined to the time period 0 to $T_L$, the form of g(t) can be determined simply from the overall response.

That is to say that with a system of the form shown in FIG. 13, it is possible to measure all that is necessary in order to characterise it fully, by measuring its impulse response over a finite range, rather than for the infinite duration of its impulse response.

FIG. 13 has shown the feedback path 224 as containing a simple delay. It can be shown that the principles apply equally well in the case where the feedback loop contains a delay in series with a circuit having some other response, for example having an impulse response r(t). All that is necessary is that the delay TL exceeds the finite duration of the convolution of g(t) and r(t).

Inspection of the circuits of FIGS. 10 and 12 will reveal that, so far as the noise signal is concerned, they are of the form of the circuit 220 in FIG. 13. Thus the correlation method of our aforementioned application can be used to determine the response of the circuits in FIGS. 10 and 12 which correspond to circuit 222, notwithstanding that these circuits can not be isolated from the feedback loop. This is what is achieved by the correlator 72 in FIGS. 7 and 8. The correlator 72 measures the FIR of the circuits in FIGS. 10 and 12 as follows:

|  | Between X and Y1 | Between X and Y2 |
| --- | --- | --- |
| Figure 10 | B (f) | B (f) + C (f) = E (f) |
| Figure 12 | A (f) B (f) | A (f) B (f) + D (f) = E (f) |

FIGS. 7 and 8 describe the preferred arrangement based on FIG. 12 in which measurement is taken between X and Y2. Those skilled in the art will appreciate that all the possibilities just enumerated may however be used; the alternative point Y1 is marked on FIG. 7. Nevertheless a system in which the error is measured is preferred for the following reason. As noted in our is aforementioned co-pending application, the response of the FIR circuit can be determined from the correlation function provided that the auto-correlation function of the test signal is a delta function. Nevertheless, the auto-correlation function will still introduce an unknown scaling factor. Where a noise-like signal is generated, as in FIG. 7, this may not be too much of a problem, but it is a definite problem with the second embodiment described below.

Thus, if correlation is used to measure the unwanted feedback path in isolation, such as by using the measuring points X and Y1, the shape of the impulse response of the unwanted feedback path will be determined, but the exact amplitude will be unknown. It is therefore difficult to set the corrective feedback to be equal-and-opposite. On the other hand, if the error response is measured by using the measuring points X and Y2 so as to measure the net residual feedback after correction, then uncertainty as to its amplitude is less important. So long as the sense (sign) of the error is correctly determined, and if the shape is known, the appropriate correction can be applied.

Using this error type of measurement, what is measured is the error function, which in the time domain can be written:

$$e(t)=a(t) \otimes b(t)+d(t)$$

The aim is to make e(t) as near as possible to zero. The operation proceeds in steps. The correction d(t) is implemented and the error e(t) is measured. This measurement is made in a sampled fashion with sampling frequency $f=1/T_0$. The correction filter has n taps, and there are in fact n independent control loops, one for each tap. Each updates its tap weight by subtraction of an amount proportional to the corresponding element of the error measurement. For each of the n control loops, one can say:

$$d_{new}=d_{old}-\Delta$$

where $\Delta=\beta\gamma_n e$.

In this β is the unknown scaling factor in the correlation measurement, and $\gamma_n$ is a factor introduced deliberately to control the performance of the control loop. The above relation will converge (assuming the feedback function stays constant) provided that $\beta\gamma_n<1$ Thus if there is some idea of the value of β, then a sensible value of $\gamma_n$ can be chosen. For rapid convergence $\gamma_n$ should be as large as possible, and thus approach 1/β.

The subtraction of the error element Δ shown in the above equation is illustrated in FIG. 8 by the inclusion of the inverters 88. In practice the necessary inversion can be achieved at any of several points in the loop and will probably be the result of circuitry included in the loop for some other purpose.

Thus, in summary, FIG. 13 shows that the circuit 220 can be measured in such a way as to determine the response of the circuit 222 having an associated feedback loop 224, notwithstanding that the circuit 222 cannot be isolated from the feedback loop for measurement purposes. FIGS. 10 and 12 show that the circuits of FIGS. 4 and 5 can be regarded as containing circuits of the form of the circuit 220. In the case of FIG. 10, one can regard the feedback path 36 and the delay 110 as constituting the circuit 220 (open loop control), or one can regard the parallel combination of the feedback path 36 and the compensating path 40 with the delay 110 as constituting the circuit 220 (closed loop control). In the case of FIG. 12, one can regard the composite path 130, which contains the feedback path 36, and the delay 110 as constituting the circuit 220 (closed loop control), or one can regard the parallel combination of the composite path 130 and the compensating path 44, with the delay 110, as constituting the circuit 220 (open loop control).

In FIG. 7, the added delay 60 corresponds to the delay 110. Having measured the response of the circuit 36 of FIG. 10 or the circuit 130 of FIG. 12 by the method just described, the coefficients thus obtained are used to adjust the characteristic of the compensating path 40 in FIG. 10 or the compensating path 44 in FIG. 12. This is achieved by means of the transversal filter 76 in FIG. 7 which provides the compensating path 44 of FIG. 12.

Thus, by the addition of the delay 60 in the main signal path it becomes possible to measure the characteristic of the feedback path by a correlation method. The characteristic of the transversal filter 76, constituting the compensating path, can then be adjusted to cancel the effect of the feedback.

Gain Adjustment

The purpose of the variable-gain amplifier 56 of FIG. 7, and the manner of its adjustment, will now be described. The variable-gain amplifier 56 corresponds to the variable-gain amplifier 120 of FIGS. 11 and 12.

The variable-gain amplifier is desirable for two reasons:

(i) to regulate the power output, and (ii) to maintain the stability of the deliberate feedback loop 44.

As regards this second point, the feedback correction can is never be perfect, and it certainly will not be when the circuit is first switched on. This problem can be reduced by storing the parameters which are in effect at switch-off.

In an arrangement based on FIG. 4, it is possible to adjust the gain within the main amplifier 38 without upsetting the balance between the unwanted feedback through path 36 and the deliberate correcting feedback through path 40. In other words, the adjustment of the gain of amplifier 38 does not interact with the measurement and feedback compensation operations.

This is not the case with an arrangement based on FIG. 5, such as is shown in FIG. 7. Here a balance is desired between the composite unwanted path $A(f)B(f)$, and the added feedback $D(f)$ which should equal $-A(f)B(f)$. In this case the gain $A(f)$ of amplifier 38 is part of what is being measured, and so it is preferred that it remains constant. For this reason a separate gain control in the form of variable-gain amplifier 56 is introduced in the main signal path so as to maintain the interdependence of measurement and feedback compensation.

The variable-gain amplifier 56 could be positioned elsewhere in the loop. Clearly it could follow the delay 60, rather than be before it, but it could also be located in other positions.

The basic setting of the gain α of the amplifier 56 can be chosen so as to give a value for a for the whole main signal path through the pre-corrector 46 as desired, in the manner discussed above.

One possible approach is to start with the value of α relatively small, that is with the gain low. Correlation measurements are then made, and they are used to reduce $E(f)=A(f)B(f)+D(f)$. Then α can be increased and a new set of measurements made. This is repeated until the desired power output can be achieved without loss of stability.

The controller 78 provides this control. It monitors the outputs of the correlator 72. Precisely what it monitors and how it responds to it is not that important; it could simply form a weighted average of the magnitude of the correlation coefficients. It does not need to receive all the outputs of the correlator, but could operate with selected terms only.

Finally, the amplifier 56 can form part of an automatic gain control (AGC) system, tending to keep the signal within the range of the converters 54 and 64, and preventing any attempt to radiate more power than the amplifier 38 can produce. Perfect cancellation is never achievable, but the use of the amplifier 56 allows the cancellation to be made good enough.

Second Embodiment

The construction of a second feedback reduction system embodying the invention will now be described with reference to FIGS. 15 and 16.

Figure 15:
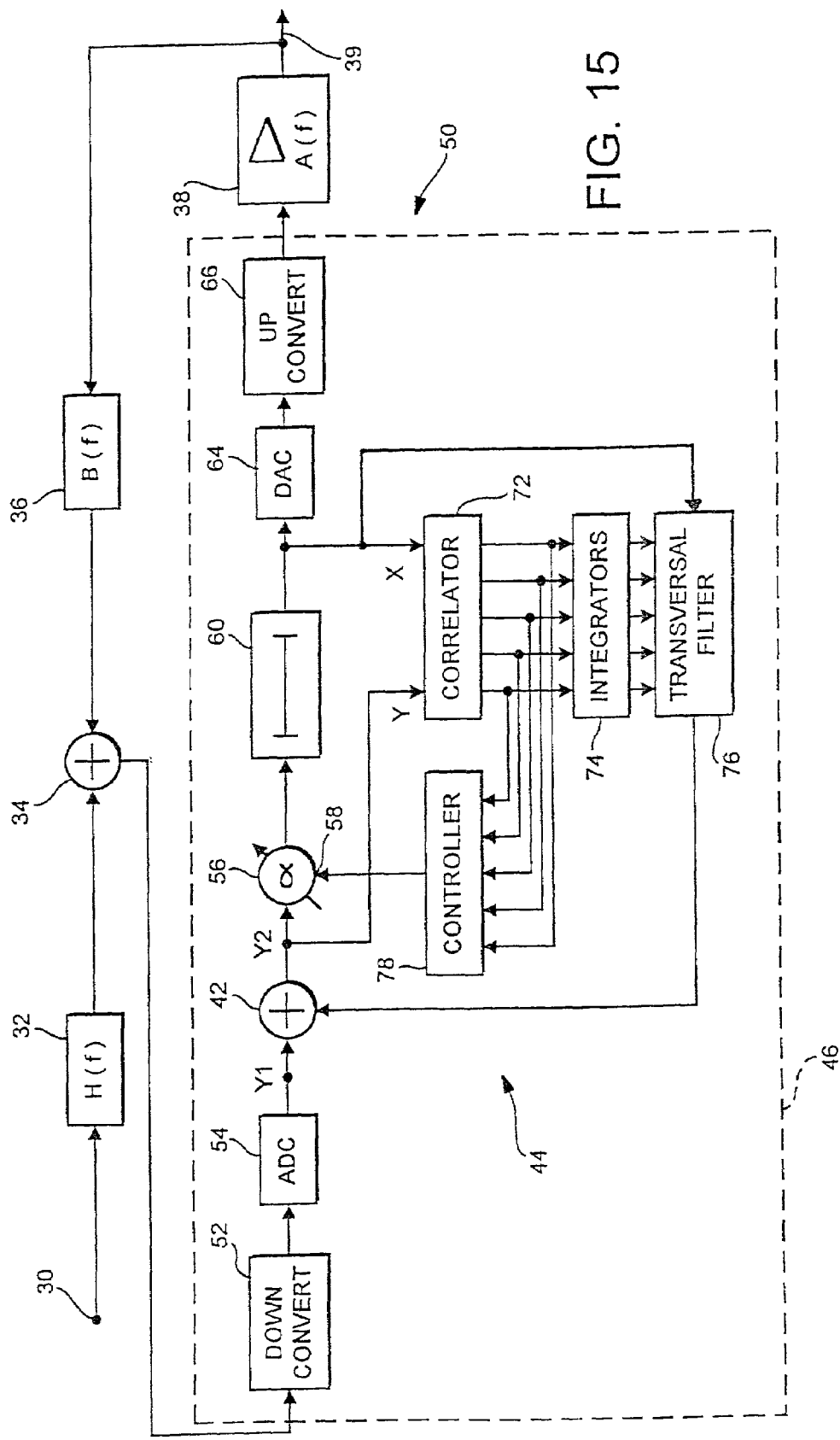
FIG. 15 is a block diagram of a second feedback reduction system embodying the invention, for use with RF (radio frequency) signals.

The circuit of FIG. 15 is also of the type shown in FIG. 5. Thus, a signal source 30 is coupled through an input path 32 and combined in a combiner 34 with unwanted feedback from a feedback path 36. The output of the combiner 34 is applied through a pre-corrector 46 to a main amplifier 38, the output 39 of which provides the desired output which also feeds the feedback path 36.

The system of FIG. 15 may be used in simultaneous coherent re-broadcast transceivers, also known as active deflectors. Such transceivers may be used by broadcasting authorities as relay stations to boost local reception in difficult areas. They could also be designed for lower power output so as to be usable in a single building, such as a house, to allow reception in any room in the house without the need for a roof-mounted aerial with an outlet in every room.

There are two main differences between the system of FIG. 15 and that of the first embodiment of FIG. 7. The first is that the received signals are at RF frequency, and not at baseband, and are converted to baseband for the correction processing and converted back to RF afterwards. This means that the phase as well as the amplitude of the signals has to be maintained, leading to the processing of complex signals, that is signals which may be regarded as having real and imaginary parts. The in-phase and quadrature channels which are necessary are not shown in FIG. 15, in order to keep the figure simple, but will be well understood by those skilled in the art.

The second main difference is that there is no added noise signal. Instead, the input signal is itself used as the test signal. This is discussed in more detail below.

The pre-corrector 46 of the feedback reduction circuit of FIG. 15 receives broadcast signals at RF frequency, and a down-converter 52 first converts them to baseband. As just noted, in order that the RF signals can be correctly regenerated at the output of the pre-corrector, it is necessary for the amplitude and phase of the down-converted signals to be retained. This means that the down-converter 52 produces two output signals, namely a 0° or in-phase signal and a 90° or quadrature-phase signal. These complex signals are processed through two parallel channels, only one of which is shown. The person skilled in the art will be familiar with the processing of complex signals in the form of real and imaginary parts, and so a more detailed description is not given here.

The down-converter 52 needs to be tuned to the RF signal being received. If the system is to be used to different RF channels, then the tuning will need to be changed (unless the system is sufficiently broad-band). When used in a low-power domestic transceiver configuration, the corrector can be arranged to be re-tuned by detecting the use of an infra-red remote-control handset of a broadcast receiver being supplied by the transceiver. Alternatively, the transceiver can be coupled to a control outlet on the receiver.

The amplification path comprising the circuit elements 52, 54, 42, 56, 60, 62, 64 and 66 contains only linear processing elements, and thus the path provides substantially linear processing on the signal passing through it.

The processing in the pre-corrector 46 is essentially done digitally, and so the input to the pre-corrector 46 is converted to digital form in an analogue-to-digital converter 54. The output of the analogue-to-digital converter is supplied to one input of the combiner 42, the output of which is applied to a series circuit comprising a variable-gain amplifier 56, the gain of which can be controlled in response to a control signal received at a control input 58 of the amplifier 56, and a delay device 60. The output of the delay device 60 is converted back to analogue form by a digital-to-analogue converter 64, and is then converted back to RF frequencies by an up-converter 66.

There is no separate noise generator, and instead the output of the delay 60 is directly applied to an input x of a correlator 72. The correlator also receives at an input Y the output of the adder 42, that is to say the signal in the main signal path prior to delay in the delay 60 and amplification in the variable-gain amplifier 56. The correlator 72 provides a plurality of outputs representing the correlation coefficients between the signals at its X and Y inputs. These outputs are applied to an integrator block 74. The outputs of the integrator block are then applied to control a transversal filter 76, which receives its signal input in a manner described below from the main signal path and provides its output to the second input of the adder 42. The output of the transversal filter is designed to compensate for the unwanted feedback.

The output of the correlator 72 is also applied to a controller circuit 78, similarly to FIG. 7, which controls the gain of the variable-gain amplifier 56 through its control input 58.

The construction of the correlator 72, the integrator block 74, and the transversal filter 76 can be as shown in FIG. 8, subject to the requirement for processing of complex signals. However, some simplification can be achieved as is shown in FIG. 16, which recognises that the signal input to the transversal filter 76 is now the same as the signal to input X of the correlator 72. Therefore only one series of delays $T_0$ is employed.

In FIG. 16, the correlator again comprises a number of stages. For simplicity of explanation, only three stages are shown, but in practice a larger number of stages will be used. The number of stages depends upon (i) the tap spacing, which is determined by the normal requirements of the Nyquist sampling thereon and the bandwidth over which the compensation is to work, i.e. at least that of the signal, and (ii) the total lengths of the response to be compensated, i.e. the extend of the convolved impulse responses of feedback path 36 and amplifier 38. Thus while only three stages are shown, it should be borne in mind that typically there will be n stages.

To the input X of the correlator 72 are connected a series of (n−1), in this case two, delays 80, each providing an incremental delay of duration To. The delay time $T_0$ is chosen according to the desired resolution of measurement of H(f) or rather its time-domain equivalent h(t). The correlator 72 also includes n multipliers 82. In this case where the down-converter 52 is used, so that complex signals have to be handled, the multipliers 82 are complex multipliers and are therefore designated with an asterisk in FIG. 16. Each multiplier receives at one input a corresponding one of the X input and the (n−1) delayed versions of the X input as supplied by the delays 80, and at the other input the signal at the Y input of the correlator 72. Finally the correlator includes n low-pass filters 84, which each receive the output of a corresponding one of the multipliers 82, and provide a corresponding output of the correlator 72. The n outputs 86 from the correlator 72 represent n correlation coefficients $\Phi_1, \Phi_2, \ldots \Phi_n$.

The n outputs 86 of the correlator 72 are applied to the controller 78 to control the gain of the variable-gain amplifier 56, in a manner similar to that described above in relation to FIG. 7.

The n outputs 86 of the correlator 72 are also applied through the inverters 88 to respective integrator circuits 90 forming the integrator block 74. The integrator circuits provide an averaging function, and hold a value which is then used by the transversal filter 76.

The transversal filter 76 has control inputs 92 connected to the integrators 90. The transversal filter 76 has n stages, corresponding to the n stages in the correlator 72, and in this simplistic example has only three stages. A series of n multipliers 98 each have one 25 input coupled to one of the input X and the (n−1) delayed versions of it supplied by the delays 80, and the other input coupled to a respective one of the inputs 92. Thus the delays 80 form part of the transversal filter as well as the correlator. The outputs of the multipliers 98 are then all applied to an adder 100, the output of which constitutes the output of the transversal filter 76, and is applied to the second input of the adder 42 in FIG. 15. The transversal filter 76 is thus seen to be of conventional design, with a tapped delay line comprising delays 80, coefficient multipliers 98 receiving respective coefficients at inputs 92, and an adder 100 providing the output; notwithstanding that the delays 80 are used in common with the correlator 72.

Figure 16:
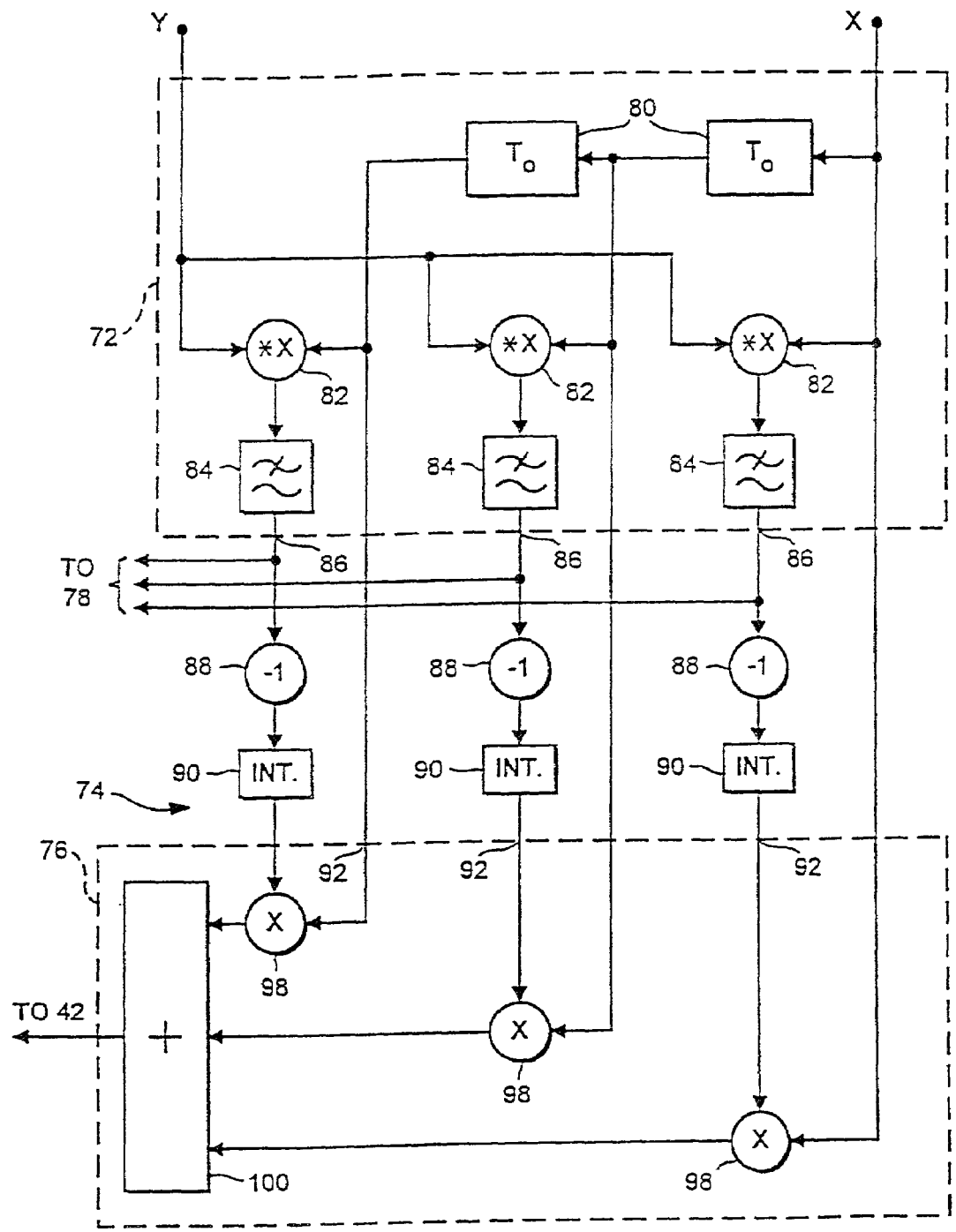
FIG. 16 shows part of the system of FIG. 15, similarly to FIG. 8.

As noted above, whether the arrangement of FIG. 8 is used or that of FIG. 16, the multipliers 82 are complex multipliers. What in fact is required, from a theoretical standpoint, is that when the multiplier multiplies its two inputs X and Y, one of them should in fact be the complex conjugate. That is to say the multiplier should form X*Y, where the asterisk indicates the complex conjugate. Two processes thus seem to be necessary to produce X*Y, namely (i) form the complex conjugate X* from X, and (ii) perform the complex multiplication X*Y.

However it can be shown that simply changing the sign of certain terms calculated in a complex multiplication achieves the same result as if one of the inputs had first been conjugated, while requiring no additional hardware.

That is:

If $X = a+jb$ and $Y = c+jd$ where a, b, c, and d are all real, and j is the square root of minus one, then the product:

$$XY = (a+jb)(c+jd) = (ac-bd) + j(ad+bc).$$

The corresponding product, in which the complex conjugate of X is taken, is however:

$$X^*Y = (a-jb)(c+jd) = (ac+bd) + j(ad-bc),$$

that is, the same as XY but with the signs of two terms both changed. To form either XY or X*Y directly from complex inputs X and Y thus requires the same number of operations. These are four real multiplications, one addition and one subtraction.

In FIG. 16 the asterisk (*) by one of the inputs of the multipliers 82 denotes an input which is, in effect, conjugated before the complex multiplication process, while requiring no more complexity than a normal complex multiplier. In principle, XY* could be used instead of X*Y.

Theory of the Second Embodiment

In certain circumstances the input signal may itself be sufficiently noise-like to fulfil the requirement of having an auto-correlation function that is substantially equal to the delta function. In that case, the correlation measurement can be achieved without the need to add an extra test signal.

Figure 17:
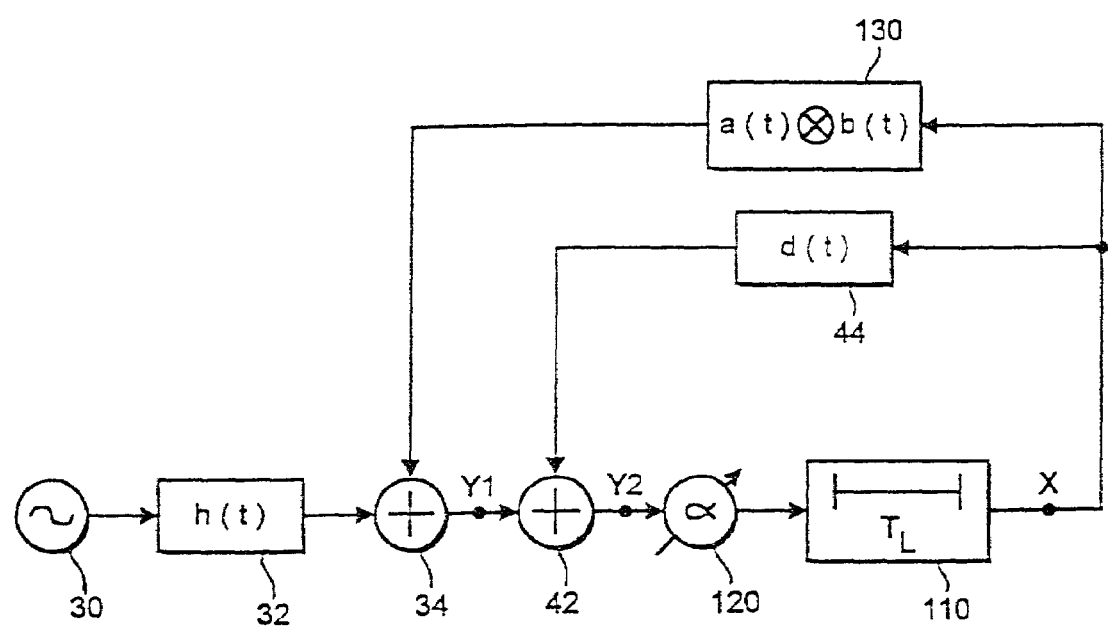
FIG. 17 is a re-arrangement of FIG. 5 illustrating the theory of operation of the second embodiment of FIG. 15.

FIG. 17 shows how the circuit of FIG. 5 can be re-arranged with the addition of the variable-gain-circuit 120 and loop delay 110, in similar manner to FIGS. 11 and 12, but without the addition of the noise source. It is seen that a circuit of the form of the circuit 220 of FIG. 13 still results. One can regard the composite path 130 and the delay 110 as constituting the circuit 220 (open loop control), or one can regard the parallel combination of the composite path 130 and the compensating path 44, with the delay 110, as constituting the circuit 220 (closed loop control).

In FIG. 15, the added delay 60 corresponds to the delay 110. Having measured the response of the circuit 130 of FIG. 17 by the above method, the coefficients thus obtained are used to adjust the characteristic of the compensating path 44. This is achieved by means of the transversal filter 76 in FIG. 15 which provides the compensating path 44 of FIG. 17.

In this instance the X input to the correlator 72 is not, of course, the output of the noise source 70 as in FIG. 7, but is the output of the delay 60. The Y input is taken from Y1 or Y2 depending on whether open-loop or closed-loop control is used; FIG. 15 shows closed-loop control, which is preferred.

Again it is seen that by the addition of the delay 60 in the main signal path it becomes possible to measure the characteristic of the feedback path by a correlation method. The characteristic of the transversal filter 76, constituting the compensating path, can then be adjusted to cancel the effect of the feedback.

Using the wanted signal as the test signal itself gives improved signal-to-noise ratio of both the measurement, and the resulting output signal, as no noise has to be added. There is also the instrumental advantage of not needing an extra circuit in the form of the noise generator.

Gain Adjustment in the Second Embodiment

The signal X(f) appearing at point X can be seen from FIG. 17 to be:

$$X(f) = \{I(f)H(f) + [A(f)B(f) + D(f)]X(f)\}\alpha e^{-j\omega T} \quad (5)$$

This can be re-arranged to give:

$$X(f) = \frac{\{I(f)H(f)\}\alpha e^{-j\omega T}}{[1 - \alpha e^{-j\omega T}\{A(f)B(f) + D(f)\}]} \quad (6)$$

In order for the auto-correlation function of the signal to be as close as possible to a delta function, X(f) should be as flat as possible across the frequency spectrum. However, X(f) will not be flat if any of the following are not flat:

(i) the original wanted-signal spectrum I(f);
(ii) the input path H(f); or
(iii) the denominator of expression (6).

The last of these, (iii), represents the extent to which the spectrum is shaped by the loop in the system. Its influence can be minimised both by keeping the gain $\alpha$ small, and by improving the balance between the unwanted and compensating feedback so that A(f)B(f)+D(f) tends to zero.

The best method of operation is thus to follow an iterative procedure as follows. Initially the value of $\alpha$ is set small, that is the gain is very low. Correlation measurements are then made and an initial set of correlation coefficients are obtained. The compensating path is adjusted to bring D(f) closer to −A(f)B(f), i.e.

A(f)B(f)+D(f) will be reduced. Then $\alpha$ is increased, and the measurement step repeated. This will further improve the compensation, and thus $\alpha$ can be increased again. These steps are repeated, until the desired power output can be achieved without loss of stability. Provided that the initial measurements yield close enough results, the process will converge to the correct setting.

Implementation

The circuits illustrated in FIGS. 7, 8 and 15, 16 have been described in terms of a hardware embodiment, with discrete circuits. It will be appreciated that the circuitry may however be implemented in part or wholly in software. In this case the figures should be regarded as equivalent to flow charts.

The circuits of FIGS. 15 and 16 may be implemented for use with orthogonal frequency division multiplex signals, as described in our European Patent Application No. 0 772 810 entitled "OPDM Active Deflector".

The most difficult part of the above procedure is at switch-on It is possible to overcome this problem by designing the system so that it is switchable between two states, in the first of which there is an added noise generator as in FIG. 7, and in the second of which the wanted signal is used as the test signal, as in FIG. 15. Initially measurements are made with added noise using the FIG. 7 configuration (it being appreciated that the down converter 52 and up converter 66 are added to FIG. 7) and the gain of the variable-gain amplifier is set to zero. Setting $\alpha$ to zero ensures that the system cannot oscillate at switch-on, and the correction can be trimmed to balance out the unwanted feedback. Once this is achieved the noise generator can be turned off or disconnected and the system re-configured as in FIG. 15. Now the wanted signal is used for measurements and the value of $\alpha$ slowly increased. As the loop now starts off in an in-balance condition, any errors should be small, so that the spectrum of the measurement signal should be sufficiently flat. This will ensure that the above iterative process converges on the correct setting as a is increased.

Reduction of the Added Delay

As is seen from the foregoing, insertion of a delay $T_L$ within the loop permits the unambiguous measurement of either the unwanted feedback itself or the error caused by the unwanted feedback when combined with the wanted signal. However, the same delay $T_L$ is introduced into the passage of the wanted signal. This has disadvantages in all the example referred to above. For example, with the first embodiment it is disadvantageous if the sound is delayed when the audience can see the speaker or performers on stage, or hear them directly as well as through the amplifier 38.

The delay 60 is under the system designer's control, and will normally be chosen to exceed the maximum delay caused in the feedback path 36. We have appreciated that, where closed-loop control is used in the correlation measurement, the delay period can be adaptively reduced.

Referring back to FIG. 14, it will be recalled that this illustrates the overall infinite impulse of a system comprising an FIR with characteristic g(t), together with an added recirculating delay $T_L$ which is longer than the extent of g(t).

Such a system is represented by the circuit block 220. The overall response of the circuit block 220 starts with a distinct version of g(t), followed by a series of overlapping and decaying echoes, as described above. If $T_L$ is shortened so that the extent of g(t) is greater than $T_L$, then the first part of the loop's response between O and $T_L$ no longer represents a complete, distinct picture of g(t). The last part of g(t) will merge with the first part of the first echo between $T_L$ and $2T_L$. Nevertheless, the first part of g(t), up to time $T_L$, remains distinct and measurable.

If this situation pertains with one of the above-described embodiments, such as in FIG. 7 or FIG. 15, where closed-loop control is used, the taps in the transversal filter 76 which cover the time up to $T_L$ will still converge correctly to the required correction. Their error measurements are never polluted by the echoes. This assumes that the unwanted feedback path is unchanging (or, in practice, changes relatively slowly). The taps in the transversal filter 76 which cover the time period beyond $T_L$ will be polluted by the echoes as this first phase of the operation takes place.

However, once the taps of the transversal filter covering the time period O to $T_L$ have converged, then the error e(t) over the period $0 \leq t \leq 2T_L$ will be zero. This means that the first part, of length $T_L$, of the first 'echo' will also be zero. Thus the measurements of the error e(t) for the period $T_L \leq t \leq 2T_L$ are also now distinct, so that the corresponding taps of the corrector can converge. This process can continue indefinitely in a 'wave of correction', sweeping outwards from the origin, for a corrector of any arbitrary length exceeding $T_L$.

It may be preferred not to try to correct the outer terms until the inner terms of the transversal filter have settled down. That is, the later corrector taps can be held at zero, as their error measurements are known to be polluted during the initial correction phase, until the coefficients for the period O to $T_L$ have been determined.

Thus $T_L$ can be chosen to be shorter than the maximum delay introduced in the feedback path and the system will still function. In principle, the delay could be reduced down to a single sampling period, in which case the coefficients will be determined one by one.

The main disadvantages is that the process takes longer to converge. Roughly speaking one can say that if the control loops are set so they each take $T_C$ to converge, then for a system where the extent of g(t) does not exceed the delay $T_L$, the loops can all settle independently in parallel and overall system convergence takes $T_C$. If the extent of g(t) does exceed the delay $T_L$, and is say $kT_L$, then convergence will take roughly $kT_C$, as the loops converge in a combined sequential/parallel fashion, $T_L$'s worth at a time. While in principle the delay $T_L$ could be reduced to a single sample delay, in this case convergence would be strictly sequential, each tap having to wait for all the previous ones to settle first. Furthermore, there could be difficulty if, as is inevitable in practice, the auto-correlation function $\Phi_{xx}(\tau)$ of the 'test signal' departs from a pure delta function.

This is the case whether the test signal is an added noise signal or the wanted signal itself. On the other hand, a simpler correlator could be employed which only evaluated the cross-correlation for a single point at a time, rather than evaluating it for all points in parallel, as in FIGS. 8 and 16.

Another problem is that the ability of such a system to cope with varying unwanted feedback paths is limited. Each time one of the 'early' taps was disturbed, many or even most of the subsequent taps are disturbed too. So, the use of a delay $T_L$ which is shorter than appears to be necessary is best suited to situations where little (or at least very slow) variation in the unwanted feedback is to be expected. The more nearly the delay $T_L$ approaches the extent of d(t), the quicker the convergence and the better the ability of the system to cope with changes in the unwanted feedback.

There may be advantages in choosing different values to $T_C$ for the control loops of the various taps, setting it to be shorter for the early ones, and longer for the later ones. Furthermore, initial lock (on switch-on or RF-channel change) might be speeded up by starting from the last-used correction, stored for the purpose.

It has been assumed that $T_L$ is chosen to be a fixed value. It may be possible to provide an adaptive arrangement in which $T_L$ starts at a large value, giving quick convergence but introducing maximum delay in the signal path, and is then successively reduced.

It will be appreciated that many modifications and variations can be made to the stems described within the scopes of the appended claims.

What is claimed is:

1. An RF active deflector for use with orthogonal frequency division multiplex signals, comprising;

an input antenna for receiving an RF input signal;

an output antenna for transmitting an RF signal on substantially the same frequency as said input signal; wherein a feedback path exists between said output antenna and said input antenna;

an amplification path between said input antenna and said output antenna, said amplification path providing substantially linear processing and including a delay; said delay providing a delay period greater than the delay in said feedback path;

means responsive to the signal in the amplification path for producing a plurality of control coefficients;

a transversal filter receiving said signal in said amplification path and controlled by said control coefficient to provide a modified signal; and a combiner for combining said modified signal with said signal in said amplification path so as to reduce the effect of the feedback.

2. An RF active deflector according to claim 1, in which said means for producing a plurality of control coefficients comprises:

means for passing through said amplification path a signal having an auto-correlation function which is substantially a delta function; and a correlator for correlating said signal before being delayed in the delay with the signal after being delayed in the delay to produce a plurality of correlation coefficients.

3. An RF active deflector according to claim 1, in which said means for producing a plurality of control coefficients comprises:

means for introducing into said amplification path a noise signal having an auto-correlation function which is substantially a delta function; and a correlator for correlating the signal before the delay with the noise signal to produce a plurality of correlation coefficients.

4. An RF active deflector according to claim 3, including means for combining said modified signal with said signal in said amplification path before said delay.

5. An RF active deflector according to claim 1, in which the amplification path includes a variable-gain amplifier.

6. An RF active deflector according to claim 5, in which the gain of said variable-gain amplifier is initially at a relatively low value and is increased as the feedback is reduced.

7. An RF active deflector according to claim 3, in which said correlator includes:
  means for multiplying one of said signals before the delay and said noise signal by a plurality of incrementally-delayed versions of the other; and
  means for selecting and accumulating the resultants of the multiplication for a time duration substantially equal in length to that of a data period of the RF signals, to produce said plurality of correlation coefficients.

8. An RF active deflector according to claim 7, in which the multiplication is a complex multiplication.

9. An RF active deflector according to claim 7, further comprising integrating means coupled to the output of the selecting and accumulating means for integrating the output thereof.

10. An RF active deflector according to claim 1, in which said delay is a variable delay, and including means for reducing the delay period of said delay from an initial value as the feedback is reduced.

11. An RF active deflector according to claim 1, in which the active deflector is used in conjunction with at least one broadcast receiver, and the tuning of the active deflector is controlled in response to a remote control device which operates the broadcast receiver.

* * * * *